United States Patent [19]
Swanson

[11] Patent Number: 4,859,967
[45] Date of Patent: Aug. 22, 1989

[54] RF POWER AMPLIFIER PROTECTION
[75] Inventor: Hilmer I. Swanson, Quincy, Ill.
[73] Assignee: Harris Corporation, Melbourne, Fla.
[21] Appl. No.: 269,191
[22] Filed: Nov. 9, 1988
[51] Int. Cl.[4] .............................................. H02H 7/20
[52] U.S. Cl. ............................... 330/298; 330/207 P;
455/117
[58] Field of Search ...................... 330/51, 207 P, 298,
330/302, 306; 455/108, 117

[56] References Cited
U.S. PATENT DOCUMENTS

| | | | |
|---|---|---|---|
| 3,345,570 | 10/1967 | Matyckas | 455/117 X |
| 4,122,400 | 10/1978 | Medendorp et al. | 330/207 P |
| 4,353,037 | 10/1982 | Miller | 330/298 |
| 4,580,111 | 4/1986 | Swanson | 332/48 X |

Primary Examiner—Steven Mottola
Attorney, Agent, or Firm—Tarolli, Sundheim & Covell

[57] ABSTRACT

An RF power amplifier is operated by supplying an RF signal to the amplifier for amplification and thereby providing an output RF signal to the amplifier's output circuit which has an impedance matching output network connected in series with a load. A detector serves to detect any reflected power in the output circuit. The RF power amplifier is turned off when the detected RF power exceeds a reference level. The amplifier is protected by discontinuing the supply of the RF signal to the amplifier while it is turned off and, instead, a frequency signal is supplied to the RF amplifier having a frequency that corresponds with that of any current flowing in the output circuit.

11 Claims, 3 Drawing Sheets

RF POWER AMPLIFIER PROTECTION

BACKGROUND AND FIELD OF THE INVENTION

The present invention relates to the art of protection circuitry for a power amplifier and, more particularly, for RF power amplifiers of the type employed in AM radio broadcasting.

It is known in the art to provide VSWR protection circuitry for use in protecting an RF power amplifier to insure that the power amplifier is not damaged at high levels of VSWR. Such protection circuits, for example, will sense the forward power level and the reflected power level and control the transmitted output power when the ratio of the reflected power to the forward power becomes too great. Such a circuit is disclosed in U.S. Patent to G. D. Miller, U.S. Pat. No. 4,353,037.

It is also known in the prior art to protect an RF power amplifier by turning the amplifier off for a short period in the presence of detected high VSWR conditions which may be caused by lightning. However, it has been determined that even after the transmitter has been turned off, energy stored in the output network of such an RF transmitter may cause RF current to flow for a short period. The frequency of this stored energy will not be exactly the same as the RF signal obtained from the RF oscillator which drives the power amplifier. Consequently, the current in the output network of the power amplifier will not be in phase with the drive applied to various transistors employed in the power amplifier. These transistors may take the form of MOS-FET transistors connected together in a bridge circuit, such as that illustrated in my U.S. Pat. No. 4,580,111 entitled "Amplitude Modulation Using Digitally Selected Carrier Amplifiers", and which patent issued on Apr. 1, 1986. As will be discussed in greater detail hereinafter, the transistors in such amplifiers may fail during this operation.

It has been determined that failure of these transistors may be prevented by discontinuing the supply of the RF signal to the power amplifier when the amplifier is turned off and instead supplying to the RF amplifier a frequency signal having a frequency corresponding with that of any signal flowing in the output network.

SUMMARY OF THE INVENTION

It is an object of the present invention to prevent RF power amplifier failure by turning off the amplifier in response to detected high reflected power conditions in the amplifier's output network and discontinuing the supply of the RF signal to the amplifier while supplying the amplifier with a frequency signal having a frequency corresponding to that of any current flowing in the output network. In accordance with the present invention, an RF power amplifier is operated by supplying an RF signal to the amplifier to be amplified so as to thereby provide an output RF signal to the amplifier's output circuit which includes an impedance matching output network connected in series with a load. Reflected power in the output circuit is then detected and the RF power amplifier is turned off when the detected reflected power exceeds a reference level. Supply of the RF signal to the power amplifier is discontinued when the amplifier is turned off and, instead, a frequency signal is supplied to the RF amplifier having a frequency corresponding with that of any current flowing in the output network.

Still further in accordance with the present invention, there is provided an RF power amplifier system having improved amplifier protection. An RF oscillator is employed for purposes of supplying an RF input signal to an actuatable RF power amplifier having an ON condition and an OFF condition. When ON, the RF power amplifier normally receives and amplifies the input RF signal to provide an amplified output RF signal. The output circuit receives RF signal and this output circuit includes an impedance matching network and a load connected together in series. A first signal is provided which is representative of the level of any reflected power in the output circuit and this signal is compared with a reference level to provide a control signal when the first signal exceeds that of the reference level This control signal is employed for actuating the RF amplifier to its OFF condition. A frequency signal is developed having a frequency corresponding with that of any current flowing in the output circuit A switch serves to normally supply the input RF signal to the power amplifier and in response to the control signal will disconnect the RF signal and, instead, supply the frequency signal to the power amplifier.

BRIEF DESCRIPTION OF THE DRAWINGS

The foregoing and other objects and advantages of the the present invention will become more readily apparent from the following detailed description as taken in conjunction with the accompanying drawings, wherein.

DESCRIPTION OF A PREFERRED EMBODIMENT

One application of the present invention is in conjunction with protecting RF power amplifiers employed in an AM broadcast transmitter. An example of such a transmitter is presented in FIG. 1 and takes the form of a digital amplitude modulator such as that illustrated and described in my aforesaid U.S. Pat. No. 4,580,111, which is assigned to the same assignee as the present invention, the disclosure of which is herein incorporated by reference. The discussion which follows is directed to an explanation of the operation of the circuitry shown in FIG. 1 followed by a detailed description of a power amplifier as illustrated in FIGS. 2 and 2A herein as background for the discussion of the invention presented with respect to the embodiment illustrated herein in FIG. 3.

Figure 1:
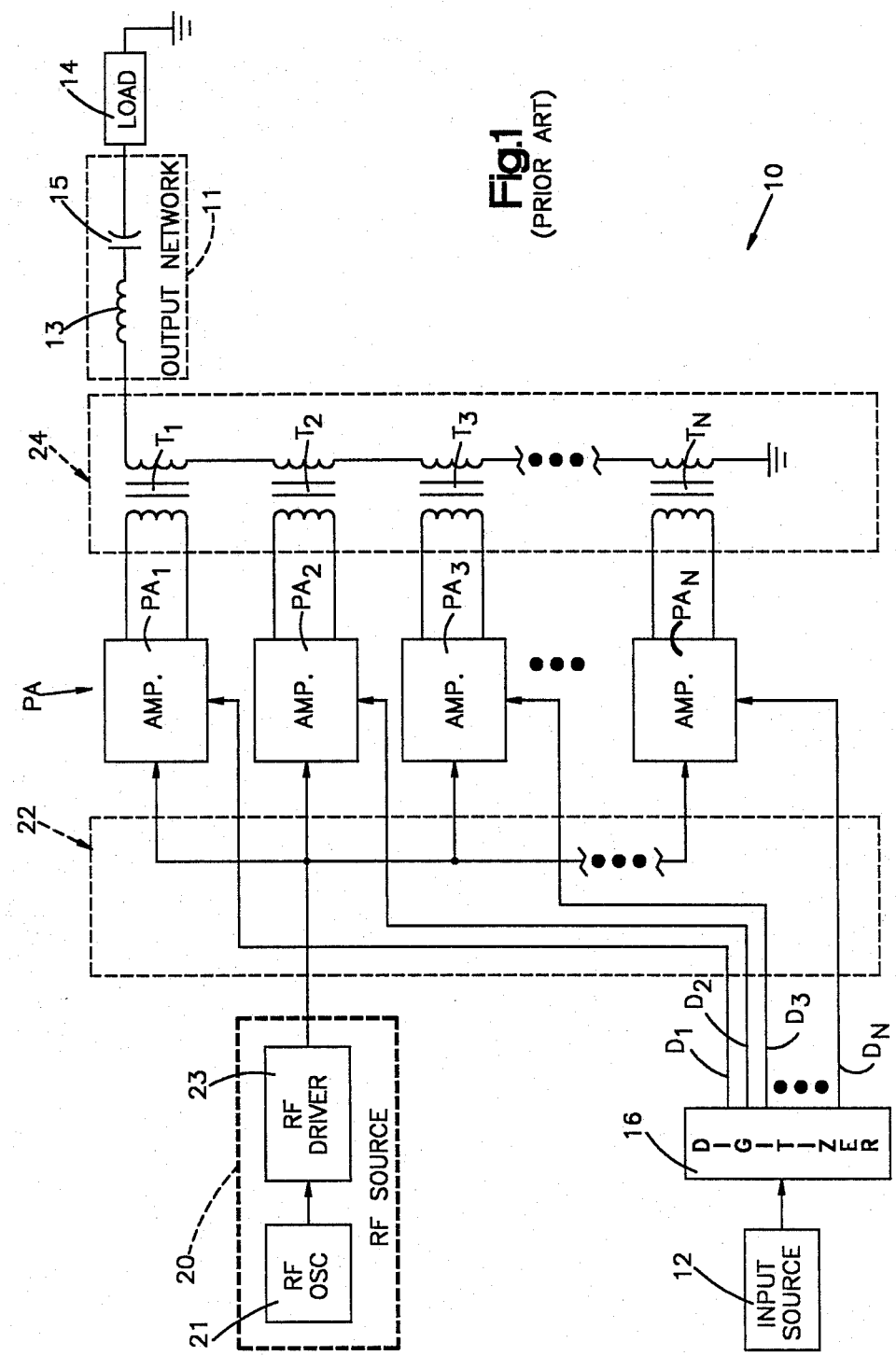
FIG. 1 is a schematic-block diagram of one application to which the present invention may be applied.
Figures 2, 2A:
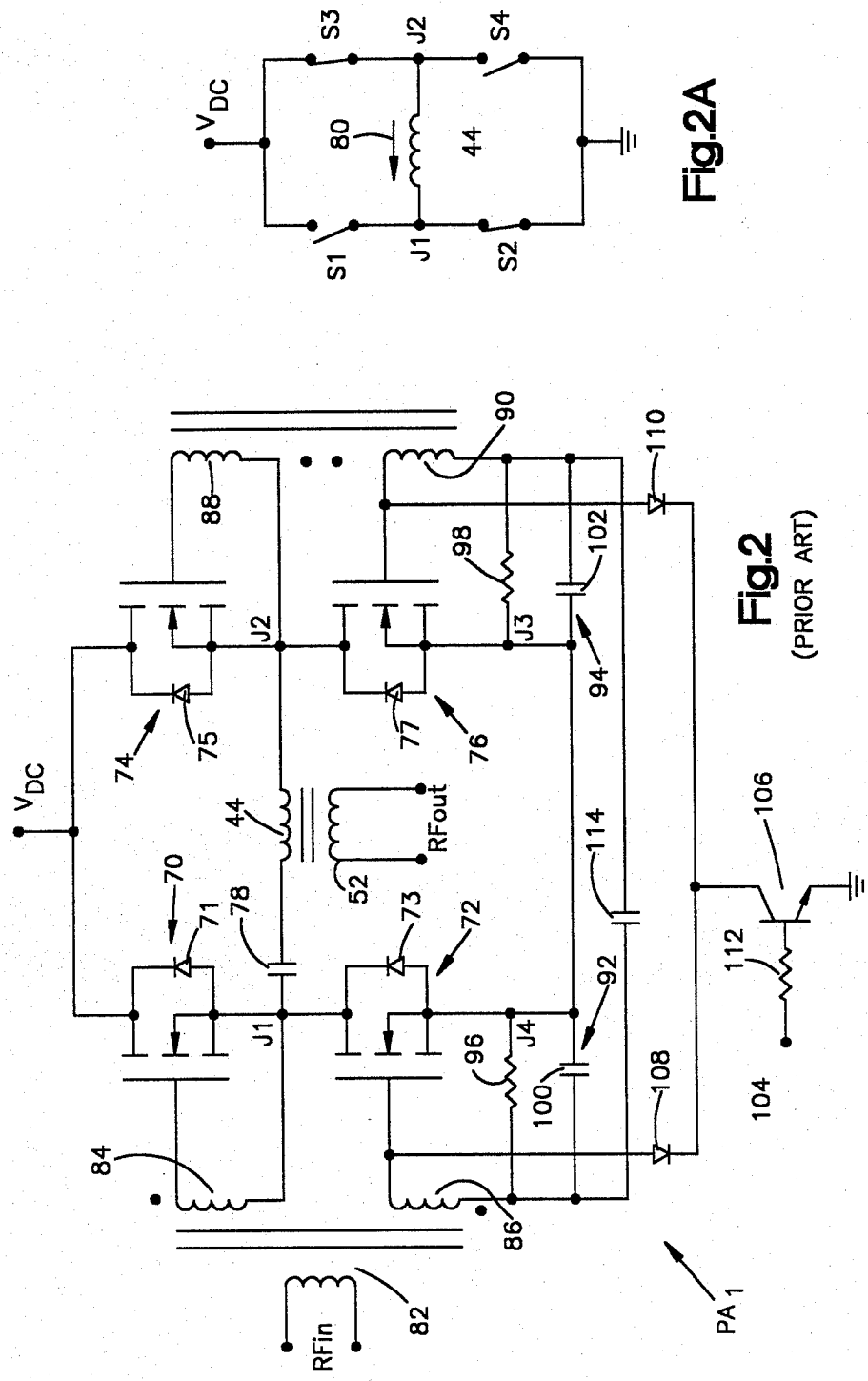
FIG. 2 is a schematic circuit illustration of one of the power amplifiers employed in FIG. 1.
FIG. 2A is a simplified schematic circuit useful in understanding the operation of the circuit shown in FIG. 2.

Referring now to FIG. 1, the amplitude modulator 10 is illustrated as receiving an input signal from input source 12 which may be the source of an audio signal. Modulator 10 generates an RF carrier signal which is amplitude modulated as a function of the amplitude of the input signal from source 12. The amplitude modulated carrier signal is provided on an output line connected to a load 14, which may take the form of an RF transmitting antenna. A digitizer 16 provides a plurality of digital control signals D1 through DN which have values which vary in accordance with the instantaneous level of the input signal. The control signals are binary signals each having a binary 1 or a binary 0 level. The number of signals having binary 1 or binary 0 levels is dependent upon the instantaneous level of the input signal.

Each of the output control signals D1–DN is supplied to one of a plurality of N RF power amplifiers $PA_1$–$PA_N$. The control signals serve to turn associated power amplifiers either on or off. Thus, if the control signal has a binary 1 level, then its associated amplifier is inactive and no signal is provided at its output. However, if the control signal is of a binary 0 level, then the power amplifier is active and an amplified carrier signal is provided at its output. Each power amplifier has an input connected to a single common RF source 20. The RF source 20 serves as the single source of an RF carrier signal which is supplied by way of an RF splitter 22 so that each amplifier $PA_1$–$PA_N$ receives a signal of like amplitude and phase and frequency. The carrier signal is amplitude modulated in accordance with the control signals D1–DN and the amplitude modulated carrier signals will be of like frequency and phase. These signals are supplied to a combiner circuit 24 comprised of a plurality of transformers Thd 1, $T_2$, $T_3$, ..., $T_N$. The secondary windings act as an independent signal source, whereby the signals provided by the various transformers additively combine with one another to produce a combined signal which is supplied to the load 14. This combined signal has the same frequency as the RF signal supplied by the RF source 20, but the amplitude of the combined signal is modulated in accordance with the input signal supplied by the input source 12.

As is conventional in such a system, the RF source 20 includes an RF oscillator 21 having a frequency on the order of 500 to 1600 KHz. This oscillator feeds an RF driver 23, the output of which is supplied to the power amplifiers $PA_1$–$PA_N$. The RF driver provides power amplification of the RF signal obtained from oscillator 21 prior to the signal being supplied to the power amplifiers at which modulation also takes place. The RF driver 23 may include several stages of amplification and may be configured similar to the power amplifiers $PA_1$–$PA_N$.

FIG. 2 illustrates one form which the power amplifier $PA_1$ of FIG. 1 may take, the other power amplifiers $PA_2$–$PA_N$ being similar. The power amplifier illustrated includes four semiconductor amplifier elements 70, 72, 74 and 76 connected in a bridge arrangement across a DC power supply voltage of, for example, 250 volts. The primary winding 44 of the associated transformer 36 is connected across the bridge junctions $J_1$ and $J_2$ of the four semiconductor elements.

More particularly, the semiconductor amplifier elements are metal oxide semiconductor, field effect transistors (MOSFETs') having three electrodes, conventionally identified as the gate, drain, an source. The drain-source paths of the transistors 70 and 72, representing their primary current paths, are connected in series across the DC power supply, as are the drain-source current paths of transistors 74 and 76. The primary winding 44 of the corresponding combiner transformer T1 is connected in series with a DC blocking capacitor 78 across the common junctions $J_1$ and $J_2$ between transistors 70 and 72 and transistors 74 and 76.

The transistors 70, 72, 74 and 76 effectively operate as switches to connect the two sides of the primary winding 44 to either the DC voltage source or to ground. By proper operation of these transistors, the transformer winding 44 can be connected in either direction across the DC power supply.

This can perhaps be more readily understood by reference to FIG. 2A, which is a simplified illustration of the FIG. 2 circuitry. In FIG. 2A the transistors 70, 72, 74 and 76 are respectively characterized by conventional single pole, single throw switches $S_1$, $S_2$, $S_3$ and $S_4$. As shown in FIG. 2A, the switch $S_1$ is open and the switch $S_2$ is closed, whereby the common junction $J_1$ between them is grounded. The switch $S_3$ is closed and the switch $S_4$ open, however, whereby the junction $J_2$ between those switches is connected to the DC supply voltage. Current will therefore pass through the primary winding 44 in the direction indicated by the arrow 80.

When all four switches $S_1$–$S_4$ are thrown to their opposite states, current will pass through the output winding 44 in the opposite direction. Thus, when switches $S_1$ and $S_4$ are closed and switches $S_2$ and $S_3$ opened, junction $J_1$ is connected to the DC supply and junction $J_2$ is connected to ground. In this case the current through the primary winding 44 of the transformer is in a direction opposite to that indicated by arrow 80 of FIG. 2A. An AC signal can thus be applied across the coil 44 by cyclically switching the switches $S_1$–$S_4$ between these two alternate states. If this is done at RF frequencies, then an RF carrier signal results.

Referring back to FIG. 2, the transistor switches 70, 72, 74 and 76 are controlled by signals applied to their gate electrodes. The gate signals for all four transistors are derived from individual secondary windings of a single transformer. This transformer has a toroidal ferrite core with a primary winding 82 and four secondary windings 84, 86, 88 and 90 wound around it. The turns ratio of the transformer is 1:1, whereby the same signal appearing at the primary is applied to each of the circuits connected to the four secondary windings.

Each of the four secondary windings is connected between the gate and source electrodes of an associated one of the MOSFETs 70–76. The secondary 84 is directly connected between the gate of MOSFET 70 and junction $J_1$, while secondary 88 is similarly directly connected between the gate of MOSFET 74 and junction $J_2$. The secondary windings 86 and 90 are in like manner connected between the gate and source electrodes of MOSFETs 72 and 76, however in these cases impedance networks 92 and 94 are connected in series with the coils 86 and 90, respectively. Each impedance network 92, 94 includes a parallel combination of a resistor 96, 98 and capacitor 100, 102. The purpose of these impedance networks will be described hereinafter during the description of the amplifier control circuitry 104.

The primary winding 82 of the toroidal transformer is connected to the output of the RF source 20, which provides a sinusoidal RF driving voltage to the power amplifier. Each MOSFET turns "on" when the RF signal applied to its gate is on its positive half cycle and "off" when the applied signal is on its negative half cycle. The MOSFETs therefore cyclically turn on and off at a frequency and phase of the applied RF gate signal. The windings 84 and 90 are connected across MOSFETs 70 and 76 in similar directions whereby the signals appearing at the gates of these transistors are in phase with one another. MOSFETs 70 and 76 therefore turn on and off in unison. Windings 86 and 88, on the other hand, are connected across MOSFETs 72 and 74 in a direction opposite to the direction of connection of windings 84 and 90. The signals applied to the gates of MOSFETs 70 and 76 are therefore 180 degrees out of phase with respect to the signals applied to the gates of transistors 74 and 72. Consequently, when transistors 70 and 76 are "on", transistors 72 and 74 are "off", and vice versa.

Due to the nonlinear transfer characteristics of the MOSFETs 70, 72, 74 and 76, the MOSFETs will abruptly turn on and off in response to the applied sinusoidal signal, rather than linearly following it. The signal applied across the junctions $J_1$ and $J_2$ will therefore have essentially a squarewave form, though at the frequency of the applied RF input signal. The load 14 to which the output of the combiner circuit 24 of FIG. 1 is connected will generally be frequency selective, and will select only the fundamental component of this squarewave.

As shown in FIG. 2, the power amplifier $PA_1$ includes a switching circuit 104 for turning the power amplifier on and off in response to the control signal appearing on the digitizer output line $D_1$. The switching circuit 104 includes an NPN bipolar junction transistor 106 having its emitter grounded and its collector connected to the gates of MOSFETs 72 and 76 through corresponding diodes 108 and 110. The base of the transistor 106 is connected to the $D_1$ output of the digitizer 24 through a base resistor 112. When the control signal applied to the base resistor 112 has a high logic level (i.e , logic "1"), base current is applied to the transistor 106, forcing it into saturation. The gates of the transistors 72 and 76 are then effectively grounded through the corresponding diodes 108 and 110. This has the effect of clamping the gate signals of these transistors to a ground potential, thereby forcing both of them to remain in an "off" condition The primary winding 44 is thus effectively disconnected from ground, thereby turning off the power amplifier When the control signal $D_1$ applied to the emitter resistor 112 has a low logic level (i.e., logic "0"), however, the transistor 106 is cut off and the operation of the amplifier 26 is substantially as described previously.

The resistors 96 and 98 in the gate circuits of MOSFETs 72 and 76 limit the DC current through transistor 106 when it is saturated. Were these not included the current through the transistor 106 would be quite high because the windings 86 and 90 act as voltage sources. The capacitors 100 and 102 bypass the resistors, reducing their effect at RF frequencies. A third capacitor 114 is connected between both capacitors 100 and 102. This capacitor improves the turn-on/turn-off characteristics of the amplifier.

One of the problems associated with operating a power amplifier, such as power amplifier $PA_1$, is the fragile nature of the MOSFET transistors 70, 72, 74 and 76. More specifically, these transistors respectively include internal diodes 71, 73, 75 and 77. These diodes are sometimes referred to as body drain diodes. These body drain diodes can be overstressed by localized heating in microseconds, resulting in destruction of the transistors. Such a condition may occur during operation when a broadcast antenna is being employed during a lightning storm. In such case, a ball gap arc due to lightning may cause current to flow in the transmitter output circuit, which is illustrated in FIG. 1 as being a series circuit with an impedance matching output network 11 and a load 14. When the reflected power in the output network is detected as being sufficiently high the transmitter may be turned off. This would be done by applying a positive signal to the base of transistor 106 in each power amplifier $PA_1$-$PA_N$ described previously. This has been done. However, with the transmitter being turned off it has been noted that the MOSFET transistors may still fail during such conditions of high reflected power in the output circuit. This has occurred because energy stored in the output network in the antenna system will cause RF current to flow for several microseconds. The frequency of this stored energy will not be exactly the same as the signal received from the RF oscillator 21 (FIG. 1) that is driving the power amplifiers $PA_1$-$PA_N$. Consequently, at some point in time, the current in the output network will not be in phase with the drive to the top transistors 70 and 74 (see FIG. 2). These transistors will act as a high impedance and will permit the RF voltage to swing down to a point where the body drain diodes 73 and 77 in the bottom transistors 72 and 76 will conduct the RF current. Then, when one of the top transistors 70 and 74 turns on, it will pull the voltage positively very rapidly on one of the bottom transistors and cause the bottom transistor to fail due to a high dynamic change in voltage with respect to time.

Figure 3:
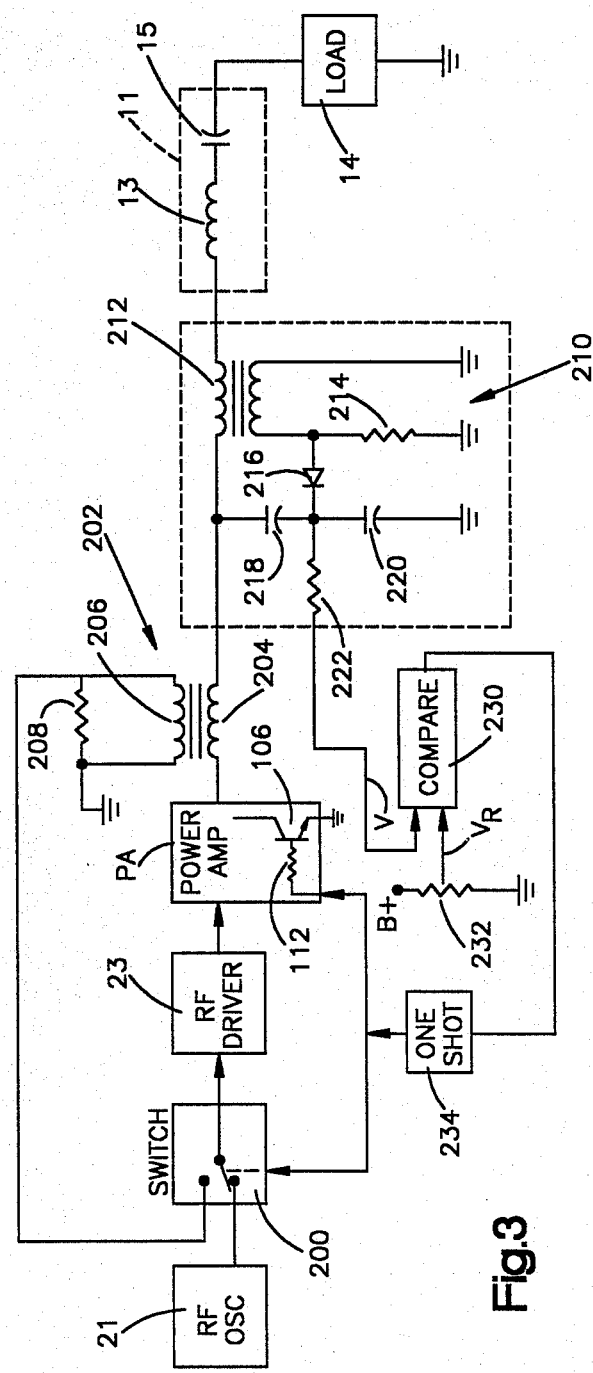
FIG. 3 is a schematic-block diagram illustration of one embodiment of the present invention.

The present invention is described in conjunction with FIG. 3 and prevents the transistor failure discussed above by switching from the oscillator as a source of drive to a signal from the output network as a source of drive when a high reflected power condition in the output circuit is detected. This will result in a situation wherein the current in the output network will be in phase with the drive to the top RF transistors when the transmitter is turned off, thereby preventing damage to the transistors.

Reference is now made to FIG. 3 which illustrates the improved protection circuitry for the power amplifier stage of FIG. 1. In FIG. 3, the power amplifier stage has been shown as a single block as power amplifier PA which is representative of one or more of the power amplifiers $PA_1$-$PA_N$. It is to be understood that a plurality of such power amplifiers are employed and their outputs would first be combined as with a combiner circuit 24 of FIG. 1. this embodiment, a switch 200 has been interposed between the RF oscillator 21 and the RF driver 23 which drives the power amplifier PA. The switch 200 serves to normally connect the RF oscillator to supply the RF driver and the power amplifier. In accordance with the present invention, the switch will be actuated to disconnect the RF oscillator 21 and, instead, connect the RF driver to a feedback circuit which will supply a frequency signal at a frequency corresponding with that of any current flowing in the output network when the transmitter is turned off because of a high reflected power condition, such as that caused by a ball gap arc due to lightning. Whereas the switch 200 is illustrated in FIG. 3 as being a single pole, double throw switch for purposes of simplification herein, it is to be appreciated that suitable transistor to switching circuitry will be employed in a practical implementation.

The feedback circuit for providing a frequency signal to the switch may take the form of a current sensor 202 and this may include a transformer having a primary winding 204 connected to the output circuit of the power amplifier. A secondary winding 206 is connected at one end to one input of the switch 200 and at the other end to ground with a resistor 208 being connected in parallel with the secondary winding 206. This current sensor 202 serves to provide a source of drive to the RF driver as a substitute for the RF oscillator when the switch 200 is actuated The frequency of this frequency signal corresponds with that of the current flowing in the output circuit.

The level of the reflected power in the output circuit of power amplifier PA may be detected with a circuit that is conventional in the art. In this embodiment, the detector may take the form of detector 210 which is illustrated in FIG. 3 and includes a current sensing transformer 212 connected in the output circuit of the power amplifier. The secondary of this transformer has one end connected directly to ground and the other end connected through a resistor 214 to ground. The junction of resistor 214 and the secondary winding is connected by means of a diode 216 to the midpoint of a pair of voltage sensing capacitors 218 and 220 which are connected together in series between ground and the output circuit of the power amplifier. An output voltage is taken from this midpoint by way of a resistor 222. This voltage V is a DC voltage having a magnitude representative of the reflected power in the output circuit Voltage V is supplied to a comparator 230 for the comparing reflected power level with a reference level $V_R$ which may be obtained from a potentiometer 232 having its resistance portion connected between a B+voltage supply source and ground. Whenever the reflected power voltage V exceeds that of the reference level $V_R$, the comparator 230 applies a control signal to a one-shot circuit 234. This one-shot circuit provides a positive level output signal for a fixed time duration, such as on the order of ten milliseconds. This positive signal serves to actuate the switch 200 to disconnect the RF oscillator 21 and substitute the current sensor 202 for supplying a frequency signal to the RF driver 23 and power amplifier PA. Also, at this time, the power amplifier PA is turned off by the positive signal obtained from the one-shot circuit 234 which is applied to the base of transistor 206 by way of resistor 212. As described hereinbefore with reference to FIG. 2, this will turn off the power amplifier PA.

With the power amplifier PA being turned off, the energy stored in the output network in the antenna system will still cause RF current to flow for several microseconds. This current will appear in winding 52 (FIG. 2) of the power amplifier causing current to flow through winding 44. The frequency of this current will now be the same as that being supplied to the power amplifier by way of switch 200 and, hence, the signals will be in phase to prevent damage to MOSFET transistors when a high level of reflected power is present in the power amplifier's output circuit.

Although the invention has been described in conjunction to a preferred embodiment, it is to be appreciated that various modifications may be made without departing from the spirit and scope of the invention as defined by the appended claims.

Having described a preferred embodiment of the invention, I claim:

1. A method for protecting an RF power amplifier comprising the steps of:
   supplying an RF signal to a said RF power amplifier to be amplified to thereby provide an output RF signal to the amplifier's output circuit having an impedance matching output network connected in series with a load;
   detecting any reflected power in said output circuit and turning off said RF power amplifier when the detected reflected power exceeds a reference level; and
   discontinuing the supply of said RF signal to said amplifier when said amplifier is turned off and instead supplying to said RF amplifier a frequency signal having a frequency corresponding with that of any current flowing in said output circuit.

2. The method as set forth in claim 1 including the step of sensing any current flowing in the output circuit of said amplifier and providing therefrom a said frequency signal and applying said frequency signal to said power amplifier instead of said RF signal during the period that said power amplifier is turned off.

3. The method as set forth in claim 2 including the step of comparing the magnitude of said detected reflected power with that of said reference level and when the magnitude of said reflected power exceeds that of said reference level, turning off said power amplifier for a fixed period of time and during said fixed period time supplying said frequency signal to said power amplifier.

4. A method for protecting an RF power amplifier comprising the steps of:
   supplying an RF signal to the said RF power amplifier to be amplified thereby to provide an output RF signal to the amplifier's output circuit having an impedance matching output network connected in series with a load;
   detecting any reflected power in said output circuit and turning off said RF power amplifier when the detected reflected power exceeds a reference level;
   sensing any current flowing in said output circuit and providing therefrom a frequency signal having a frequency corresponding with that of any said current; and,
   discontinuing the supply of said RF signal to said power amplifier when said amplifier is turned off and, instead, supplying said frequency signal to said RF amplifier.

5. The method as set forth in claim 4 including the step of turning said power amplifier off for a fixed period of time and during said fixed period of time supplying said frequency signal to said power amplifier instead of said RF signal.

6. An RF power amplifier system having amplifier protection, comprising:
   an RF source for providing an RF input signal;
   an actuatable RF power amplifier having an on condition and an off condition for, when on, normally receiving and amplifying said input RF signal to provide an amplified output RF signal;
   an output circuit for receiving said output RF signal and including an impedance matching output network and a load connected together in series;
   means coupled to said output circuit for providing a first signal representative of the level of any reflected power in said output circuit;
   means for comparing said first signal with a reference level and providing a control signal when said first signal exceeds that of said reference level;
   means responsive to said control signal for providing a turn off signal for actuating said RF amplifier to its off condition;

means coupled to sad output circuit for providing a frequency signal having a frequency corresponding with that of any current flowing in said output circuit; and actuatable switching means having a normal first condition for supplying said RF signal to said power amplifier and a second condition in response to said turn off signal for disconnecting said RF input signal and instead supplying said frequency signal to said power amplifier.

7. An RF power amplifier system as set forth in claim 6 wherein said turn off signal providing means includes means for providing sad turn off signal for a fixed period of time for thereby turning off said power amplifier for said fixed period of time while at the same time actuating said switching means to supply said frequency signal to said power amplifier instead of said input RF signal for said fixed period of time.

8. An RF power amplifier system as set forth in claim 6 wherein said RF source includes an RF oscillator for providing said RF input signal.

9. An RF power amplifier as set forth in claim 6 wherein said RF source includes an RF oscillator for providing an Rf signal and an RF driver for receiving and amplifying an RF signal to provide said RF input signal for driving said RF power amplifier.

10. An RF power amplifier system as set forth in claim 9 wherein said actuatable switching means is interposed between said RF oscillator and said RF driver.

11. An RF power amplifier system as set forth in claim 10 wherein said turn off signal providing means includes means for providing said turn off signal for a fixed period of time for thereby turning off said power amplifier for said fixed period of time while at the same time actuating said switching means to supply said frequency signal to said power amplifier instead of said input RF signal for said fixed period of time.

* * * * *

UNITED STATES PATENT AND TRADEMARK OFFICE
CERTIFICATE OF CORRECTION

PATENT NO. : 4,859,967

DATED : August 22, 1989

INVENTOR(S) : Hilmer I. Swanson

It is certified that error appears in the above-identified patent and that said Letters Patent is hereby corrected as shown below:

Column 9, Line 1, change "sad" to --said--.

Column 9, Line 14, change "sad" to --said--.

Signed and Sealed this

Twenty-eighth Day of August, 1990

Attest:

HARRY F. MANBECK, JR.

*Attesting Officer*  *Commissioner of Patents and Trademarks*